United States Patent [19]
Endo et al.

[11] Patent Number: 5,990,537
[45] Date of Patent: Nov. 23, 1999

[54] SEMICONDUCTOR DEVICE WITH FUSE

[75] Inventors: Toru Endo; Yoshinori Okajima, both of Kawasaki, Japan

[73] Assignee: Fujitsu Limited, Kawasaki, Japan

[21] Appl. No.: 08/166,910

[22] Filed: Dec. 15, 1993

Related U.S. Application Data

[63] Continuation of application No. 07/939,697, Sep. 2, 1992, abandoned.

[30] Foreign Application Priority Data

Sep. 4, 1991 [JP] Japan .................. 3-224207

[51] Int. Cl.⁶ .............. H01L 29/94; H01L 29/74
[52] U.S. Cl. ............ 257/529; 257/208; 257/209
[58] Field of Search .................. 257/170, 208, 257/209, 127, 529

[56] References Cited

U.S. PATENT DOCUMENTS

| | | | |
|---|---|---|---|
| 4,893,167 | 1/1990 | Boudou et al. | 257/209 |
| 4,967,256 | 10/1990 | Pathak et al. | 257/112 |
| 5,025,300 | 6/1991 | Billig et al. | 257/529 |

FOREIGN PATENT DOCUMENTS

| | | |
|---|---|---|
| 0 025 347 | 3/1981 | European Pat. Off. . |
| 0 076 967 | 4/1983 | European Pat. Off. . |
| 0 112 693 | 7/1984 | European Pat. Off. . |
| 0 241 046 | 10/1987 | European Pat. Off. . |
| 64-23566 | 1/1989 | Japan . |
| 64-80037 | 3/1989 | Japan . |

OTHER PUBLICATIONS

*Patent Abstracts of Japan*, vol. 9, No. 248 (E–347)[1971] Oct. 4, 1985 & JP–A–60 098664 (Mitsubishi) Jun. 1, 1985.

*Primary Examiner*—Valencia Martin Wallace
*Attorney, Agent, or Firm*—Staas & Halsey LLP

[57] ABSTRACT

A semiconductor device with a fuse is formed on a semiconductor substrate having a base semiconductor substrate and an epitaxial semiconductor layer formed thereon and defining a major surface of the semiconductor substrate. An isolation region is formed in the epitaxial semiconductor so as to completely surround and electrically isolate a selected region of the epitaxial layer on which the narrow, blowable portion of the fuse is disposed. A field oxide layer and an insulating layer are formed, in turn, over the fuse and on the main surface of the semiconductor layer and a passivation layer is formed on the insulating layer having an opening therein defined by interior sidewalls of the passivation layer which surround the selected region and which are disposed interiorally of the isolation region, and through which first opening a corresponding service of the insulating layer is exposed. A nitride layer is formed on the passivation layer, including the sidewalls thereof defining the first opening, and covering the exposed surface portion of the insulating layer, a second opening being formed in the nitride layer and exposing a surface portion of the insulating layer, the second window being smaller than the first window and not greater than the blowable portion of the fuse.

28 Claims, 4 Drawing Sheets

SEMICONDUCTOR DEVICE WITH FUSE

This application is a continuation of application Ser. No. 07/939,697, filed Sep. 2, 1992, now abandoned.

BACKGROUND OF THE INVENTION

1. Field of the Invention

The present invention relates to a semiconductor device (e.g., a memory device) including fuses used, variously, for redundant circuitry or programming. For example, fuses are formed in a decoder of a static random-access memory (SRAM).

2. Description of the Related Art

A fuse of the semiconductor device is blown, as needed and using an electric current pulse or laser, for replacing a defective circuit with a redundant circuit or for programming (writing) information in a memory cell. A partial structure of the semiconductor device including a fuse has been designed to prevent an electrical short-circuit between a semiconductor substrate and a circuit including the fuse from occurring and to prevent moisture from entering into an interior of the device from the atmosphere.

Two conventional semiconductor devices with a fuse are now explained with reference to FIGS. 1A, 1B, 2A and 2B, respectively.

As shown in FIGS. 1A and 1B, a portion of a first conventional semiconductor device including a fuse comprises a semiconductor substrate 1 consisting of a p-type silicon base substrate 2 and an n-type epitaxial silicon layer 3 formed thereon. In the epitaxial layer 3 a p-type isolation region 4 of a rectangular ring configuration (FIG. 1A) is formed to extend in the base substrate 2, so that a portion 3A of the epitaxial layer, below a narrow blowable portion 5A of a fuse 5, is isolated from the base substrate 2 and the other portion i.e., the portion exterior of the isolation region 4) of the epitaxial layer 3. On the substrate 1 (i.e., on the epitaxial layer 3), a field oxide layer 6 of $SiO_2$ is formed. The fuse 5 of polycrystalline silicon, aluminum or other metal is formed on the field oxide layer 6 and has the narrow portion 5A (FIG. 1A) to be blown. An insulating layer 7 of, e.g., PSG (phosphosilicate glass) is formed over the fuse 5 and the field oxide layer 6 for isolating lower interconnections (conductive lines) including the fuse from upper interconnections. Furthermore, a passivation layer 8 of, e.g., PSG is formed on the insulating layer 7, and a nitride layer 9 of, e.g., $Si_3N_4$ is formed on the passivation layer 8. Since the passivation PSG layer 8 is hygroscopicity (i.e., has low moisture-resistance), the nitride layer 9 having a high moisture-resistance prevents moisture from penetrating into the semiconductor device. The layers 9 and 8 are selectively etched to form an opening 10 above the narrow portion 5A.

As the occasion demands, the narrow portion 5A of the fuse 5 is irradiated with a laser beam through the opening 10, or a pulse current is fed through the fuse 5, so as to blow the fuse 5 by breaking the narrow portion 5A. The opening 10 facilitates the breaking of the narrow portion, and the insulating layer 7 prevents the broken portion from splashing (i.e., being disposed).

When fusing, the broken portion of the fuse 5 may cause damage (cracks) to the field oxide layer 6, which may to extend into the epitaxial layer 3, producing a short circuit between the fuse 5 and the epitaxial layer 3 and thereby causing trouble. The isolation region 4 is formed to prevent the short from causing trouble.

As shown in FIGS. 2A and 2B, a portion of a second conventional semiconductor device including a fuse comprises a semiconductor substrate 11 and a field oxide layer 16 of $SiO_2$ formed on the substrate. The substrate 11 may consist of a silicon base substrate and an epitaxial layer (layer shown) formed thereon. A fuse 15 with a narrow blowable portion 15A is made of polycrystalline silicon, aluminum or other metal and is formed on the field oxide layer 16. An insulating layer of, e.g., PSG is formed over the fuse 15 and the field oxide layer 16 for isolating lower interconnections (conductive lines) including the fuse from upper interconnections. The insulating layer 17 is selectively etched to form a groove 17, surrounding the narrow portion 15A, except for two displaced, or separated, portions or gaps therein corresponding to the fuse 15. A metal guard ring 21 of, e.g., aluminum is formed to overfill the groove and come into contact with the field oxide layer 16. The guard ring 21 is separated into two portions each having a light channel shape (i.e., a cross-sectional shape of a light weight metal channel), as shown in FIG. 2A.

As mentioned above, in the first conventional device, a passivation layer 18 of, e.g., PSG is formed over the metal guard ring 21 and the insulating layer 17, and a nitride layer 19 of, e.g., $Si_3N_4$ is formed on the passivation layer 18. The layers 19 and 18 are selectively etched to form an opening 20 above the narrow portion 15A. The fuse 15 is blown by breaking the narrow portion 15A with a laser beam or a pulse current. Of course, some of a number of the fuses are selectively blown in accordance with demands, while the majority of the fuses are not blown.

Since portions of the insulating 17 and the passivation layer 18 are exposed in the opening 20, moisture penetrates into the inside of the device through the layers 17 and 18. To prevent the moisture penetration, the metal guard ring 21 is formed so as to vertically extend through the insulating layer 17 and thereby to separate the portion of the layer 17 adjacent to and surrounding the narrow portion 15A from the rest thereof.

However, in the first conventional semiconductor device (FIGS. 1A and 1B), the moisture penetrates into the inside of the device, through the insulating layer 7 and the interface between the layers 7 and 8 from the exposed portion of the layer 7 within the opening 10. The moisture which penetrates to the inside deteriorates aluminum interconnections (lines) and active elements (e.g., transistors) of the device. Furthermore, when the cracks of the insulating layer 6 and the passivation layer 7 are caused by blowing the fuse 5, moisture may penetrate through the respective interfaces between the layers 6 and 7 and between the epitaxial layer 3 and the layer 6 from the cracks. In the second conventional semiconductor device (FIGS. 2A and 2B), when blowing the fuse 15, cracks in the layers 16 and 17 may also occur and cause trouble, such as a short circuit or moisture penetration.

The nitride layer 9 (or 19) of the first (or second) semiconductor device is formed to protect the passivation PSG layer 8 (or 18) except for the opening 10 (or 20), with the result that a side of the layer 8 (or 18) and a portion of the layer 7 (or 17) are exposed in the opening. Therefore, the nitride layer does not sufficiently contribute to improving the moisture-resistance of the semiconductor device.

SUMMARY OF THE INVENTION

An object of the present invention is to improve the prevention of moisture penetration into the inside of the semiconductor device.

Another object of the present invention is to provide a semiconductor device which avoids problems of a short circuit which is caused by damage thereto when blowing a fuse.

The above-mentioned objects and other objects of the present invention are attained by providing a semiconductor device with a fuse comprising: a semiconductor substrate; a field oxide layer formed on the semiconductor substrate; a fuse formed on the field oxide layer; an insulating layer over the fuse and the field oxide layer; a passivation layer formed on the insulating layer and having an opening above the fuse; and a nitride layer formed on the passivation layer; according to the present invention, the semiconductor device further comprising a metal guard ring which surrounds a narrow blowable portion of the fuse and is formed under the passivation layer so as to extend to the semiconductor substrate through the insulating layer and the field oxide layer.

Preferably, the semiconductor substrate consists of a base semiconductor substrate having a first conductivity type and an epitaxial semiconductor layer having a second conductivity type, opposite to the first conductivity type, and is provided with an isolation region of the first conductivity type, which isolation region is formed in the epitaxial semiconductor layer so as to completely surround and isolate a portion of the epitaxial layer below the narrow portion and the metal guard ring that comes into direct contact with the isolation region.

It is possible in accordance with the invention to form a trench isolation layer of an insulator which extends to the base semiconductor substrate through the epitaxial semiconductor layer so as to completely surround and isolate a portion of the epitaxial layer below the narrow portion, and the metal guard that is directly formed on the isolation layer.

Preferably, the nitride layer extends on a portion of the insulating layer exposed in the opening except at least a part of which extends above the narrow portion of the fuse.

BRIEF DESCRIPTION OF THE DRAWINGS

The present invention will be more apparent from the description of the preferred embodiments set forth below, with reference to the accompanying drawings, in which.

DESCRIPTION OF THE PREFERRED EMBODIMENTS

First Embodiment

Figure 3A:
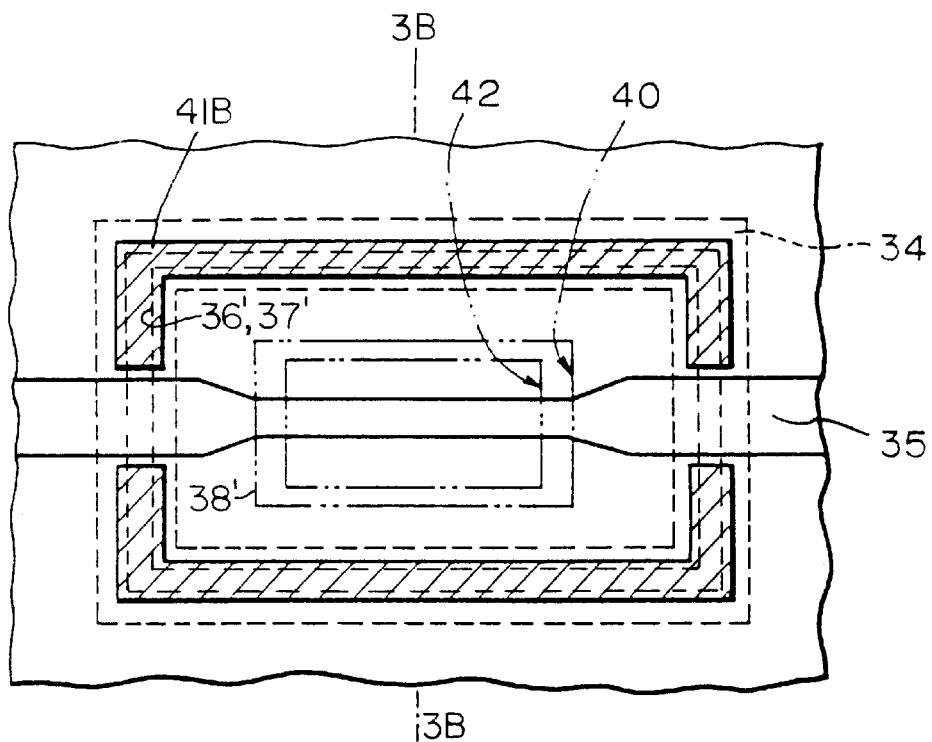
FIG. 3A is a schematic planar view of a semiconductor device according to a first embodiment of the present invention of which a passivation layer, a nitride layer and a portion of an insulating layer are removed, generally in a plane along line 3A—3A in FIG 3B.
Figure 3B:
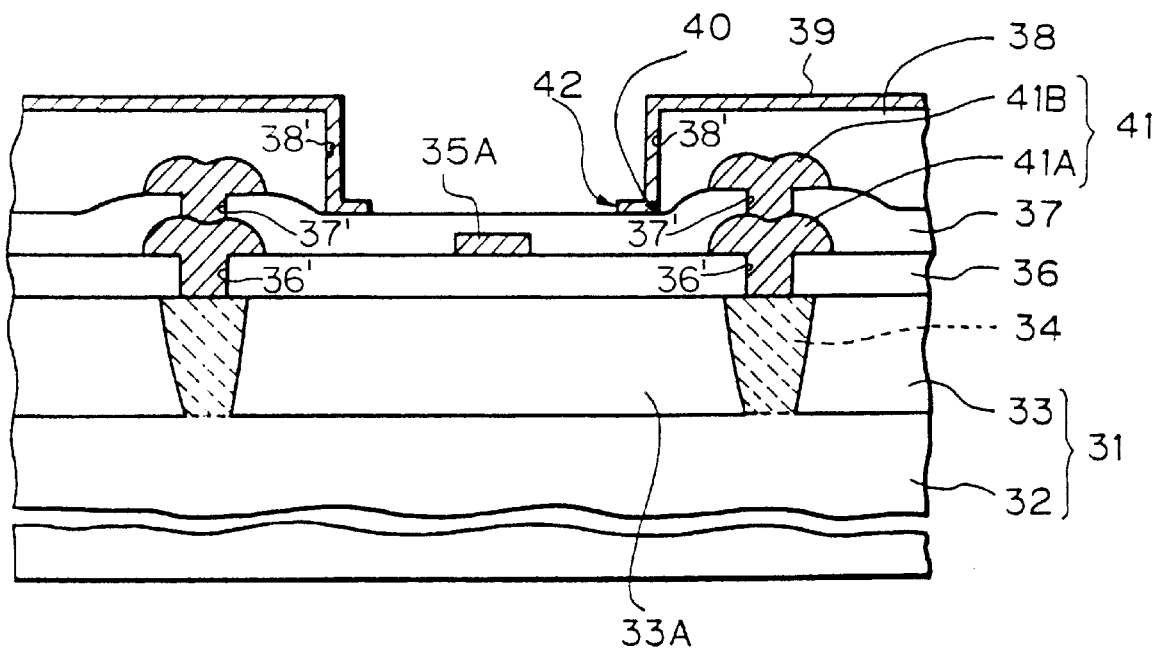
FIG. 3B is a schematic sectional view of the semiconductor device of FIG. 3A, taken along line 3B—3B of FIG. 3A.

Referring to FIGS. 3A and 3B, a portion of a semiconductor device according to a first embodiment of the present invention including a fuse comprises a semiconductor substrate 31 consisting of a p-type silicon base substrate 32 and an n-type epitaxial silicon layer 33, formed thereon. In the epitaxial layer 33 a p-type isolation region 34 of a rectangular ring configuration (FIG. 3A) is formed by doping acceptor impurities therein so as to extend into the base substrate 32, so that an interior portion 33A of the epitaxial layer 33, below a narrow blowable portion 35A of a fuse and within region 34, is isolated from the base substrate 32 because of the respective, opposite conductivity types thereof, and thus from the remaining portion of the epitaxial layer 33, exterior of the region 34 by the p-type isolation region 34, in a manner similar to that of the first conventional semiconductor device. A field oxide layer 36 of $SiO_2$ is formed on the epitaxial layer 33 by, e.g., thermally oxidizing the silicon layer 33.

Figure 1A:
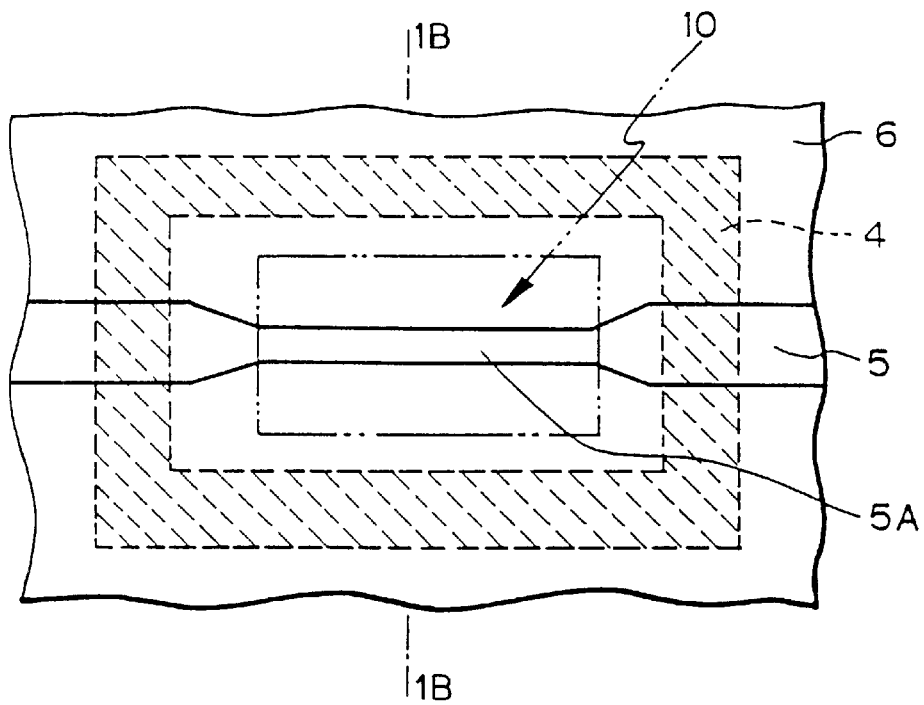
FIG. 1A is a schematic planar view of a first conventional semiconductor device of which an insulation layer, a passivation layer and a nitride layer are removed, generally in a plane along line 1A—1A in FIG. 1B.
Figure 1B:
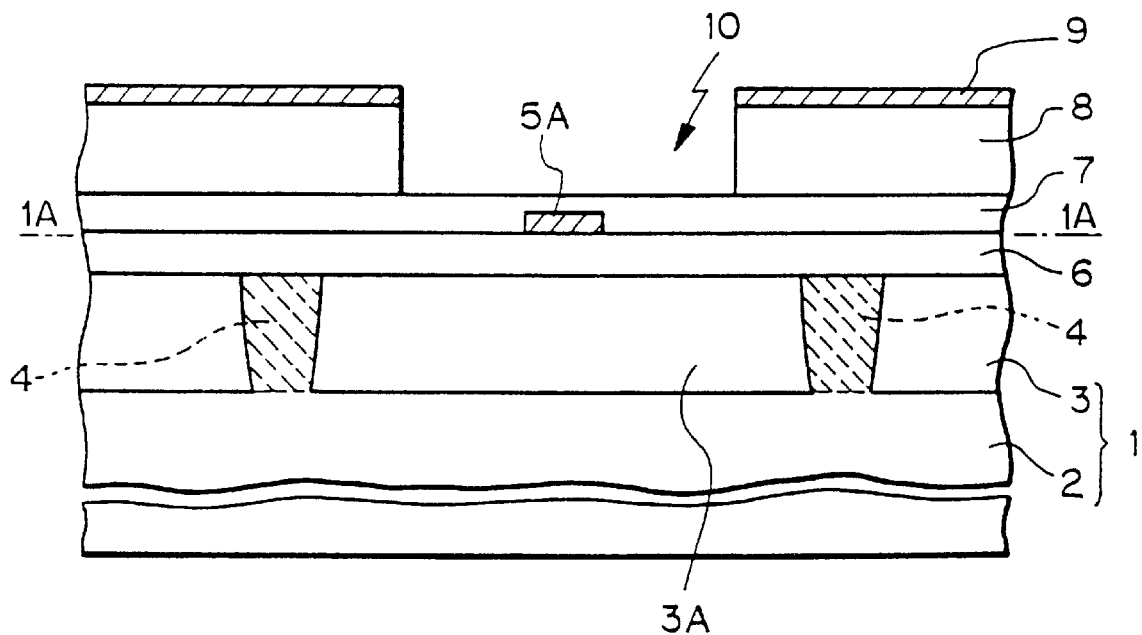
FIG. 1B is a schematic sectional view of the first conventional semiconductor device taken along line 1B—1B of FIG. 1A.
Figure 2A:
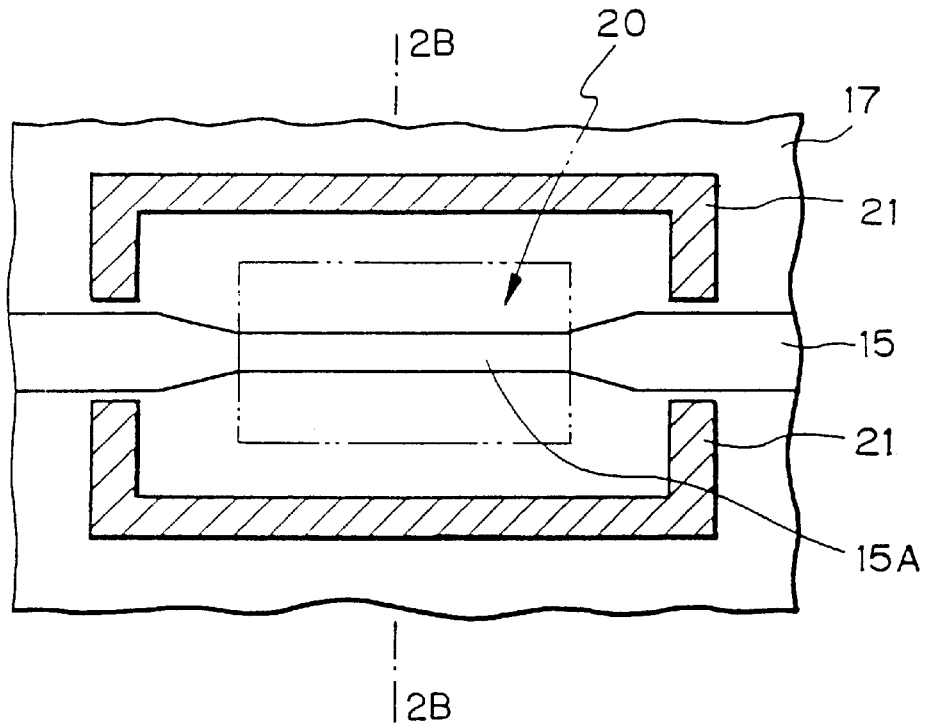
FIG. 2A is a schematic planar view of a second conventional semiconductor device of which an insulating layer, a nitride layer and a portion of a passivation layer are removed, generally in a plane along line 2A—2A in FIG 2B.
Figure 2B:
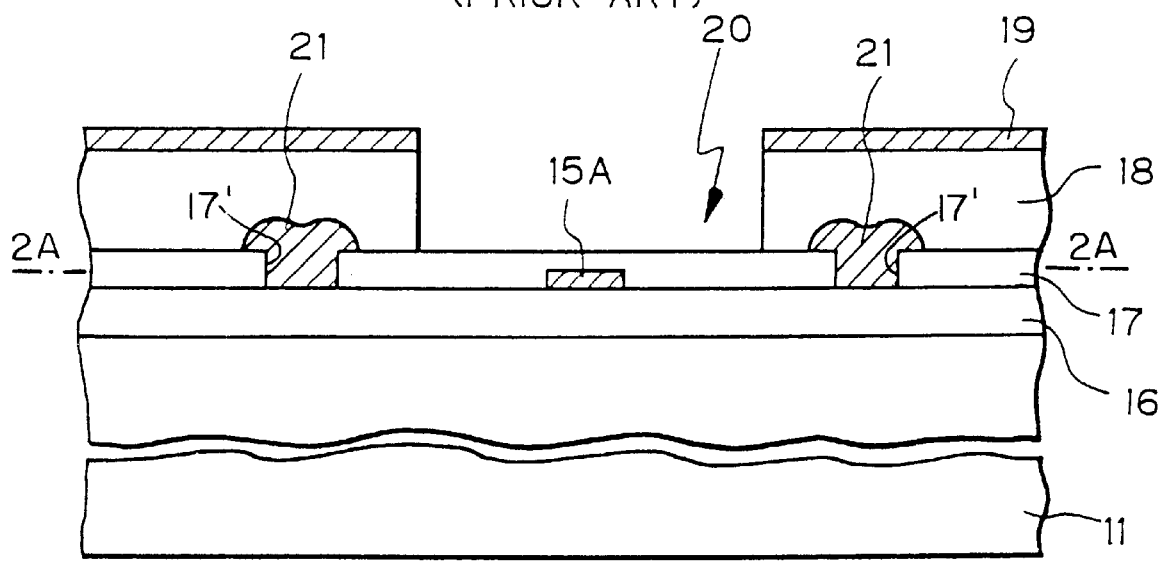
FIG. 2B is a schematic sectional view of the second conventional semiconductor device taken along line 2B—2B of FIG. 2A.

A polycrystalline silicon layer is deposited on the field oxide layer 36 by a chemical vapor deposition (CVD) process and is patterned by lithography to form a fuse 35 having the narrow portion 35A. The field oxide layer 36 is selectively etched by lithography to form a groove 36' surrounding the narrow portion 35A except for two portions under that portion of the fuse 35 disposed on corresponding portions of the isolation region 34. The groove 36' is separated into the same two portions, with a light channel shape, as in FIG. 2A. A first metal guard ring 41A of, e.g., aluminum, is formed by depositing a metal layer and selectively etching it, thereby to overfill the groove but only to come into contact with the isolation region 34. The first guard ring 41A is separated into the same two portions, as in FIG. 2A and with a light channel shape, as shown in FIG. 3A. It is preferable that the formation of the first guard metal ring 41A is carried out at the same time as when (lower) interconnections (conductive lines) are formed. The fuse 35 alternative may be made of a metal, such as aluminum (Al), tungsten (W), tungsten silicide (WSi), titanium (Ti) and titanium nitride (TiN), instead of polycrystalline silicon.

Then, an insulating layer 37 of, e.g., PSG is formed over the metal guard ring 41A, the fuse 35 and the field oxide layer 36 by a CVD process and is selectively etched by lithography to form another (i.e., a second) groove 37' having the same shape as the above-mentioned groove 36'. A second metal guard ring 41B of, e.g., aluminum, is formed by depositing a metal layer and selectively etching it thereby to overfill the groove but only to and come into contact with the first metal ring 41A. The second guard ring 41B is separated into the same two portions and with a light channel shape and thus being of the same configuration as the first guard ring 41A. It is preferable that the formation of the second guard metal ring 41B be carried out at the same time as when the other (upper) interconnections (conductive lines) are formed. The second guard ring 41B joins integrally with the first guard ring 41A thereby to form a solid metal guard ring 41 as the composite of both. Thus, the interior portions of the layers 36 and 37 adjacent to and surrounding the narrow portion 35A are substantially separated from the remaining, exterior portions of the layers 36 and 37 by, and relatively to, the metal guard ring 41. It is preferable that one of the metal guard rings 41A and 41B be connected with an interconnection (conductive line) for applying a bias voltage to the isolating region 34. It is also possible in the alternative to use any of an aluminum alloy W, WSi, Ti or TiN, as a conductive material of the metal guard ring.

A passivation layer 38 of, e.g., PSG is formed over the metal guard ring 41 and the insulating layer 37, and is selectively etched to form a first opening 40 above the narrow portion 35A. Then, a nitride layer 39 of, e.g., $Si_3N_4$ is formed on the passivation layer 38 and within the opening 40 so as to cover the exposed side wall 38 ' of the layer 38 and the exposed surface portion of the layer 37. The nitride layer 39 is selectively etched to form another (i.e., a second) opening 42, above the narrow fuse portion 35A and within, i.e., interiorially of, the opening 40, as shown in FIG. 3A. The opening 42 is smaller than the opening 40, and thus the nitride layer 39 covers the side wall 38' of the passivation layer 38, the edge of the interface between the layers 37 and 38 and a peripheral edge portion 37' (as shown in FIG. 3A, bounded by the respective spaced edges of the openings 40 and 42) of the exposed surface of layer 37 within the opening 40, but does not exist above (i.e., does not cover) the narrow fuse portion 35A. Thus, the semiconductor device with the fuse in accordance with the invention is obtained.

The fuse 35 of the semiconductor device is blown by breaking the narrow portion 35A with a laser beam or a pulse current in the conventional manner. Some of a number of the fuses are selectively blown in accordance with demands, while the majority of the fuses are not blown.

According to the present invention, the metal guard ring 41 vertically extends through the layesr 36 and 37 and comes into contact with the substrate 31 (i.e., the epitaxial layer 33), and thereby prevents moisture from penetrating into the inside of the device through the insulating (hygroscopic) layer 37 and through cracks caused during blowing of the fuse portion 35A and interfaces between the layers 37 and 36 and between the layer 36 and the substrate 31. The nitride layer 39 covers the interior side wall 38' of the passivation layer 38 and the interface between the layers 38 and 37 and the related peripheral edge portion of the exposed surface of the layer 37 within the opening 40 as well as the top surface of the layer 38, thereby to prevent moisture from penetrating through the layer 38 and the interface. Furthermore, the isolation region 34 prevents the short circuit trouble, as mentioned above in the prior art explanation. Since the metal guard ring 41 comes into contact with the isolation region, when an bias voltage is applied to the isolation region 34 through the metal guard ring 41, the electrical isolation effect of the isolation region is increased. For example, the lowest voltage is applied to the p-type isolation region 34 through the metal guard ring 41 to intensify the isolation effect, which more certainly prevents the short circuit trouble.

Second Embodiment

Figure 4:
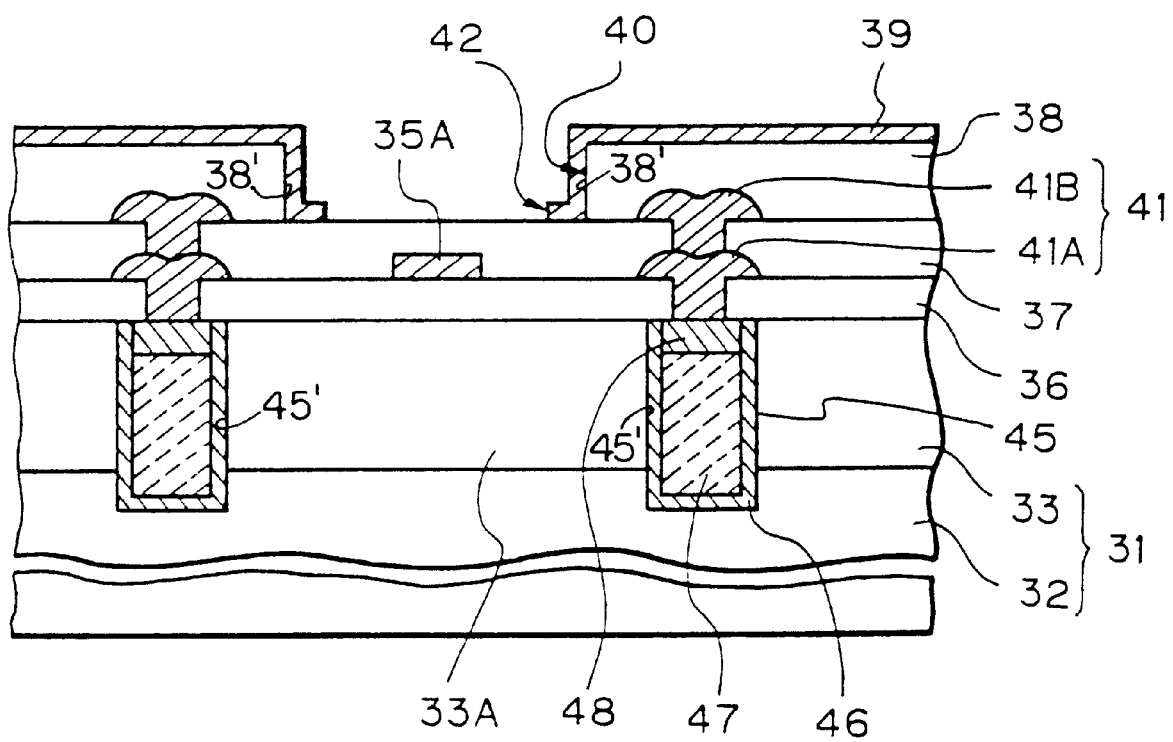
FIG. 4 is a schematic sectional view of a semiconductor device with a trench isolation layer according to another embodiment of the present invention.

Referring to FIG. 4, a semiconductor device according to a second embodiment of the present invention is similar to the device of the first embodiment except that a trench isolation layer 45 is formed in the substrate instead of the isolation region 34 as in FIGS. 3A and 3B. Preferably, the trench isolation layer 45 comprises a thin $SiO_2$ layer 46 formed on the side and bottoms walls of a U-groove 45', a filler 47 of, e.g., polycrystalline silicon and a lid (i.e., a top enclosure) $SiO_2$ layer 48 of the filler. Reference numerals in FIG. 4 which are the same as those used in FIGS. 3A and 3B indicate the same parts or similar parts of the device of FIGS. 3A and 3B.

In the production of the device of FIG. 4 and, after the growth of the epitaxial layer 33 of the substrate 31, the substrate 31 is selectively and anisotropically etched by, e.g., a reactive ion etching (RIE) process to form a U-groove 45' of a rectangular ring configuration which is similar to the isolation region 34 (FIG. 3A). The groove extends into the semiconductor base substrate 32. The substrate 31 is thermally oxidized to form the thin $SiO_2$ layer 46 on the side and bottom wall surfaces of the groove 45' at the same time, a thin $SiO_2$ layer (not shown) is also formed on the top surface of the epitaxial layer 33. A polycrystalline silicon layer is deposited over the whole surface of the substrate and so as to fill the groove 45' and is then selectively removed so as to leave a portion thereof within only the groove 45' as the filler 47. The thin $SiO_2$ layer formed on the epitaxial layer 33 is removed by an etching process. Next, an upper portion of the filler 47 and the epitaxial layer 33 are thermally oxidized to form the lid (i.e., top enclosure) $SiO_2$ layer 48 and the field oxide layer 36. Thus, the trench isolation layer 45 is formed.

As mentioned in the first embodiment, the fuse with the narrow blowable portion 35A, the first metal guard ring 41A coming into contact with the lid $SiO_2$ layer 48, the insulating layer 37, the second metal guard ring 41B, the passivation layer 38 having the opening 40 therein, and the nitride layer 39 having the opening 42 therein are formed to produce the semiconductor device in accordance with the second embodiment of the invention.

The metal guard ring 41, comprising a composite of of the first and second metal guard rings 41A and 41B, and the nitride layer 39 extending on the top surface and side wall 38' of layer 38 and onto the peripheral edge of the exposed surface of layer 37 within the opening 40 prevent moisture from penetrating to the inside of the device. The trench isolation layer 45 prevents the short circuit trouble. Therefore, the quality of the semiconductor device with a fuse is remarkable improved.

It will be obvious that the present invention is not restricted to the above-mentioned embodiments and that many variations are possible for persons skilled in the art without departing from the scope of the invention.

We claim:

1. A semiconductor device with a fuse, comprising:
   a semiconductor substrate having a major surface and comprising a base layer of a first conductivity type and an epitaxial layer of a second conductivity type, opposite to the first conductivity type, formed on the base layer, the epitaxial layer having a first main surface corresponding to and defining the major surface of the semiconductor substrate, the major surface of the semiconductor substrate having defined therein a first selected surface portion with a corresponding first perimeter;
   an isolation region of the first conductivity type having a surface exposed at the major surface of the semiconductor substrate, the isolation region extending along the perimeter of the first selected surface portion and from the major surface and through the epitaxial layer to the base layer and thereby surrounding a region of the epitaxial layer corresponding to the first selected surface portion of the major surface of the semiconductor substrate;
   a field oxide layer formed on the major surface of the semiconductor substrate and having a second main surface, the second main surface having a second selected surface portion and associated second perimeter defined therein, respectively corresponding to and aligned with the first selected surface portion and associated first perimeter;
   a fuse elongated in a first direction and formed on and extending in the first direction along the second main surface of the field oxide layer, the fuse having a blowable central portion disposed within the second selected surface portion of the second main surface of the field oxide layer interconnecting opposite end portions of the fuse which extend beyond the associated second perimeter of the second selected surface portion of the second main surface of the field oxide layer, the central portion having a narrower dimension in a second direction, transverse to the first direction, than the corresponding dimension in the second direction of the end portions of the fuse;

an insulating layer formed on the fuse and the second main surface of the field oxide layer and having a third main surface, the third main surface having a third selected surface portion and corresponding third perimeter defined therein, respectively corresponding to and aligned with the first and second selected surface portions and associated first and second perimeters;

a metal guard ring formed on the third main surface of the insulating layer and extending along at least selected portions of the third perimeter and thus in surrounding relationship with respect to the third selected surface portion of the third main surface of the insulating layer, the metal guard ring extending through the insulating layer and the field oxide layer into contact with the exposed surface of the isolation region;

a passivation layer formed on the third main surface of the insulating layer and on, and covering, the metal guard ring and having a fourth major surface, the passivation layer having a first opening therein, defined by corresponding interior sidewalls thereof and disposed interiorly of the metal guard ring, the first opening exposing therethrough a corresponding first exposed surface portion, smaller than and disposed within the third selected surface portion, of the third main surface of the insulating layer; and a nitride layer formed on the fourth main surface of the passivation layer, the interior sidewalls of the passivation layer and the third selected surface portion of the third main surface of the insulating layer, the nitride layer having a second opening therein, defined by corresponding interior sidewalls thereof, smaller than and disposed within the first opening in the passivation layer and exposing therethrough a corresponding second exposed surface portion of the insulating layer which is smaller than and disposed interiorly of the first exposed surface portion of the third main surface of the insulating layer, the nitride layer accordingly including a portion thereof covering a peripheral edge surface portion of the first exposed surface portion of the third main surface of the insulating layer defined by the first opening in the passivation layer.

2. A semiconductor device as recited in claim 1, wherein the second opening is smaller in the first direction than the length of the central portion of the fuse in the first direction.

3. A semiconductor device as recited in claim 1, wherein the fuse comprises a conductive material selected from the group consisting of:

polycrystalline silicon, aluminum, tungsten, tungsten silicide, titanium and titanium nitride.

4. A semiconductor device as recited in claim 1. wherein the metal guard ring comprising a material selected from the group consisting aluminum, aluminum alloy and polycrystalline silicon.

5. A semiconductor device as recited in claim 1, wherein the insulating layer and said passivation layer are made of PSG.

6. A semiconductor device with a fuse, comprising:

a semiconductor substrate having a major surface and comprising a base layer of a first conductivity type and an epitaxial layer of a second conductivity type, opposite to the first conductivity type, formed on the base layer, the epitaxial layer having a first main surface corresponding to and defining the major surface of the semiconductor substrate, the major surface of the semiconductor substrate having defined therein a first selected surface portion with a corresponding first perimeter;

an isolation region of an insulating material having a surface exposed at the major surface of the semiconductor substrate, the isolation region extending along the perimeter of the first selected surface portion and from the major surface and through the epitaxial layer to the base layer and thereby surrounding a region of the epitaxial layer corresponding to the first selected surface portion of the major surface of the semiconductor substrate;

a field oxide layer formed on the major surface of the semiconductor substrate and having a second main surface, the second main surface having a second selected surface portion and associated second perimeter defined therein, respectively corresponding to and aligned with the first selected surface portion and associated first perimeter;

a fuse elongated in a first direction and formed on and extending in the first direction along the second main surface of the field oxide layer, the fuse having a blowable central portion disposed within the second selected surface portion of the second main surface of the field oxide layer interconnecting opposite end portions of the fuse which extend beyond the associated second perimeter of the second selected surface portion of the second main surface of the field oxide layer, the central portion having a narrower dimension in a second direction, transverse to the first direction, than the corresponding dimension in the second direction of the end portions of the fuse;

an insulating layer formed on the fuse and the second main surface of the field oxide layer and having a third main surface, the third main surface having a third selected surface portion and corresponding third perimeter defined therein, respectively corresponding to and aligned with the first and second selected surface portions and associated first and second perimeters;

a metal guard ring formed on the third main surface of the insulating layer and extending along at least selected portions of the third perimeter and thus in surrounding relationship with respect to the third selected surface portion of the third main surface of the insulating layer, the metal guard ring extending through the insulating layer and the field oxide layer into contact with the exposed surface of the isolation region;

a passivation layer formed on the third main surface of the insulating layer and on, and covering, the metal guard ring and having a fourth major surface, the passivation layer having a first opening therein, defined by corresponding interior sidewalls thereof and disposed interiorly of the metal guard ring, the first opening exposing therethrough a corresponding first exposed surface portion, smaller than and disposed within the third selected surface portion, of the third main surface of the insulating layer; and a nitride layer formed on the fourth main surface of the passivation layer, the interior sidewalls of the passivation layer and the third selected surface portion of the third main surface of the insulating layer, the nitride layer having a second opening therein, defined by corresponding interior sidewalls thereof, smaller than and disposed within the first opening in the passivation layer and exposing therethrough a corresponding second exposed surface portion of the insulating layer which is smaller than and disposed interiorly of the first exposed surface portion of the third main surface of the insulating layer, the nitride layer accordingly including a portion thereof covering a peripheral edge surface portion of the first exposed surface portion of the third main surface of the insulating layer defined by the first opening in the passivation layer.

7. A semiconductor device as recited in claim 6, wherein the second opening is restricted in size so as to smaller in the first direction than the length of the central portion of the fuse in the first direction.

8. A semiconductor device as recited in claim 6, wherein the fuse comprises a conductive material selected from the group consisting of:
   polycrystalline silicon, aluminum, tungsten, tungsten silicide, titanium and titanium nitride.

9. A semiconductor device as recited in claim 6, wherein the metal guard ring comprising a material selected from the group consisting aluminum, aluminum alloy and polycrystalline silicon.

10. A semiconductor device as recited in claim 6, wherein the insulating layer and said passivation layer are made of PSG.

11. A semiconductor device with a fuse, comprising:
    a semiconductor substrate comprising a base layer of a first conductivity type and an epitaxial layer of a second conductivity type, opposite to the first conductivity type, formed on the base layer and having an upper major surface;
    a field oxide layer formed on the upper major surface of the epitaxial layer and having an upper major surface;
    a fuse formed on the upper major surface of the field oxide layer, the fuse extending in a first direction and comprising a central portion of a first length in the first direction and first and second opposite end portions and the fuse having first and second longitudinal edges, spaced by and defining a varying width of the fuse in a second direction, substantially transverse to the first direction, the first and second longitudinal edges being spaced by a first width in the central portion and by a second width, greater than the first width, in the opposite end portions;
    an insulating layer formed on the field oxide layer and covering the field oxide layer and the fuse;
    an isolation region having a surface exposed at the upper major surface of the substrate and extending through the epitaxial layer into the base layer, the isolation region comprising first and second longitudinal portions, each extending in the first direction and of a second length, greater than the first length, and spaced in the second direction, respectively from the first and second longitudinal edges of the fuse and from each other by a third width, greater than the second width, and first and second transverse portions respectively and integrally joining corresponding, opposite ends of the first and second longitudinal portions, the isolation region thereby surrounding and defining an interior portion of the epitaxial layer and isolating the interior portion from a remaining portion of the epitaxial layer, exterior of the isolation region;
    a guard ring, aligned with the isolation region and formed on and extending through the insulating and field oxide layers into contact with the exposed surface of the isolation region, the guard ring comprising first and second longitudinal portions and integral first and second transverse portions respectively aligned with and contacting the first and second longitudinal portions and the first and second transverse portions of the isolation region, the first and second transverse portions of the guard ring having respective first and second openings therein through which extend, respectively, the first and second opposite end portions of the fuse;
    a passivation layer formed on the upper major surface of the insulating layer and covering the guard ring, the passivation layer having a first opening therein defined by first and second interior longitudinal sidewalls extending in the first direction, each of a third length intermediate the first and second lengths, and first and second transverse interior sidewalls extending in the second direction, each of a fourth width which is intermediate the second and third widths, a corresponding first surface portion of the insulating layer being exposed through the first opening; and
    a nitride layer formed on the passivation layer, on the interior sidewalls of the passivation layer and on the exposed, first surface portion of the insulating layer and having a second opening therein through which a corresponding, second surface portion of the insulating layer is exposed, the exposed second surface portion of the insulating layer being disposed substantially symmetrically within the first exposed surface portion and overlying the central portion of the fuse.

12. A semiconductor device with a fuse as recited in claim 11, wherein the isolation region is of the first conductivity type and electrically isolates the interior portion of the epitaxial layer from the exterior portion of the epitaxial layer.

13. A semiconductor device with a fuse as recited in claim 11, wherein the isolation region comprises an electrical insulating material and electrically insulates the interior portion of the epitaxial layer from the exterior portion of the epitaxial layer.

14. A semiconductor device with a fuse as recited in claim 11, wherein each of the isolation region, the first opening and the second opening is of a substantially rectangular configuration, the second opening being disposed substantially symmetrically in the first and second directions within and smaller than the first opening and the first opening being disposed substantially symmetrically in the first and second directions within and smaller than the rectangular configuration of the isolation region.

15. A semiconductor device with a fuse as recited in claim 11, wherein the metal guard ring is of a substantially rectangular configuration.

16. A semiconductor device with a fuse, comprising:
    a semiconductor substrate having a major surface and comprising a base layer of a first conductivity type and an epitaxial layer of a second conductivity type, opposite to the first conductivity type, formed on the base layer, the epitaxial layer having a first main surface corresponding to and defining the major surface of the semiconductor substrate, the major surface of the semiconductor substrate having defined therein a first selected surface portion with a corresponding first perimeter;
    an isolation region of the first conductivity type having a surface exposed at the major surface of the semiconductor substrate, the isolation region extending along the perimeter of the first selected surface portion and from the major surface and through the epitaxial layer to the base layer and thereby surrounding a region of the epitaxial layer corresponding to the first selected surface portion of the major surface of the semiconductor substrate;

a field oxide layer formed on the major surface of the semiconductor substrate and having a second main surface, the second main surface having a second selected surface portion and associated second perimeter defined therein, respectively corresponding to and aligned with the first selected surface portion and associated first perimeter;

a fuse elongated in a first direction and formed on and extending in the first direction along the second main surface of the field oxide layer, the fuse having a blowable central portion disposed within the second selected surface portion of the second main surface of the field oxide layer interconnecting opposite end portions of the fuse which extend beyond the associated second perimeter of the second selected surface portion of the second main surface of the field oxide layer, the central portion having a narrower dimension in a second direction, transverse to the first direction, than the corresponding dimension in the second direction of the end portions of the fuse;

an insulating layer formed on the fuse and the second main surface of the field oxide layer and having a third main surface, the third main surface having a third selected surface portion and corresponding third perimeter defined therein, respectively corresponding to and aligned with the first and second selected surface portions and associated first and second perimeters; and a metal guard ring formed on the third main surface of the insulating layer and extending along at least selected portions of the third perimeter and thus in surrounding relationship with respect to the third selected surface portion of the third main surface of the insulating layer, the metal guard ring extending through the insulating layer and the field oxide layer into contact with the exposed surface of the isolation region.

17. A semiconductor device as recited in claim 16, wherein the fuse comprises a conductive material selected from the group consisting of:

polycrystalline silicon, aluminum, tungsten, tungsten silicide, titanium and titanium nitride.

18. A semiconductor device as recited in claim 16, wherein the metal guard ring comprising a material selected from the group consisting aluminum, aluminum alloy and polycrystalline silicon.

19. A semiconductor device as recited in claim 16, wherein the insulating layer is made of PSG.

20. A semiconductor device with a fuse, comprising:

a semiconductor substrate having a major surface and comprising a base layer of a first conductivity type and an epitaxial layer of a second conductivity type, opposite to the first conductivity type, formed on the base layer, the epitaxial layer having a first main surface corresponding to and defining the major surface of the semiconductor substrate, the major surface of the semiconductor substrate having defined therein a first selected surface portion with a corresponding first perimeter;

an isolation region of an insulating material having a surface exposed at the major surface of the semiconductor substrate, the isolation region extending along the perimeter of the first selected surface portion and from the major surface and through the epitaxial layer to the base layer and thereby surrounding a region of the epitaxial layer corresponding to the first selected surface portion of the major surface of the semiconductor substrate;

a field oxide layer formed on the major surface of the semiconductor substrate and having a second main surface, the second main surface having a second selected surface portion and associated second perimeter defined therein, respectively corresponding to and aligned with the first selected surface portion and associated first perimeter;

a fuse elongated in a first direction and formed on and extending in the first direction along the second main surface of the field oxide layer, the fuse having a blowable central portion disposed within the second selected surface portion of the second main surface of the field oxide layer interconnecting opposite end portions of the fuse which extend beyond the associated second perimeter of the second selected surface portion of the second main surface of the field oxide layer, the central portion having a narrower dimension in a second direction, transverse to the first direction, than the corresponding dimension in the second direction of the end portions of the fuse;

an insulating layer formed on the fuse and the second main surface of the field oxide layer and having a third main surface, the third main surface having a third selected surface portion and corresponding third perimeter defined therein, respectively corresponding to and aligned with the first and second selected surface portions and associated first and second perimeters; and a metal guard ring formed on the third main surface of the insulating layer and extending along at least selected portions of the third perimeter and thus in surrounding relationship with respect to the third selected surface portion of the third main surface of the insulating layer, the metal guard ring extending through the insulating layer and the field oxide layer into contact with the exposed surface of the isolation region.

21. A semiconductor device as recited in claim 20, wherein the fuse comprises a conductive material selected from the group consisting of:

polycrystalline silicon, aluminum, tungsten, tungsten silicide, titanium and titanium nitride.

22. A semiconductor device as recited in claim 20, wherein the metal guard ring comprising a material selected from the group consisting aluminum, aluminum alloy and polycrystalline silicon.

23. A semiconductor device as recited in claim 20, wherein the insulating layer is made of PSG.

24. A semiconductor device with a fuse, comprising:

a semiconductor substrate comprising a base layer of a first conductivity type and an epitaxial layer of a second conductivity type, opposite to the first conductivity type, formed on the base layer and having an upper major surface;

a field oxide layer formed on the upper major surface of the epitaxial layer and having an upper major surface;

a fuse formed on the upper major surface of the field oxide layer, the fuse extending in a first direction and comprising a central portion of a first length in the first direction and first and second opposite end portions and the fuse having first and second longitudinal edges, spaced by and defining a varying width of the fuse in a second direction, substantially transverse to the first direction, the first and second longitudinal edges being spaced by a first width in the central portion and by a second width, greater than the first width, in the opposite end portions;

an insulating layer formed on the field oxide layer and covering the field oxide layer and the fuse;

an isolation region having a surface exposed at the upper major surface of the substrate and extending through the epitaxial layer into the base layer, the isolation region comprising first and second longitudinal portions, each extending in the first direction and of a second length, greater than the first length, and spaced in the second direction, respectively from the first and second longitudinal edges of the fuse and from each other by a third width, greater than the second width, and first and second transverse portions respectively and integrally joining corresponding, opposite ends of the first and second longitudinal portions, the isolation region thereby surrounding and defining an interior portion of the epitaxial layer and isolating the interior portion from a remaining portion of the epitaxial layer, exterior of the isolation region; and a guard ring, aligned with the isolation region and formed on and extending through the insulating and field oxide layers into contact with the exposed surface of the isolation region, the guard ring comprising first and second longitudinal portions and integral first and second transverse portions respectively aligned with and contacting the first and second longitudinal portions and the first and second transverse portions of the isolation region, the first and second transverse portions of the guard ring having respective first and second openings therein through which extend, respectively, the first and second opposite end portions of the fuse.

25. A semiconductor device with a fuse as recited in claim 24, wherein the isolation region is of the first conductivity type and electrically isolates the interior portion of the epitaxial layer from the exterior portion of the epitaxial layer.

26. A semiconductor device with a fuse as recited in claim 24, wherein the isolation region comprises an electrical insulating material and electrically insulates the interior portion of the epitaxial layer from the exterior portion of the epitaxial layer.

27. A semiconductor device with a fuse as recited in claim 24, wherein each of the isolation region, the first opening and the second opening is of a substantially rectangular configuration, the second opening being disposed substantially symmetrically in the first and second directions within and smaller than the first opening and the first opening being disposed substantially symmetrically in the first and second directions within and smaller than the rectangular configuration of the isolation region.

28. A semiconductor device with a fuse as recited in claim 24, wherein the metal guard ring is of a substantially rectangular configuration.

* * * * *